United States Patent [19]
Hundt et al.

[11] Patent Number: 5,590,462
[45] Date of Patent: Jan. 7, 1997

[54] PROCESS FOR DISSIPATING HEAT FROM A SEMICONDUCTOR PACKAGE

[75] Inventors: Michael J. Hundt, Double Oak, Tex.; Carlo Cognetti, Milan, Italy

[73] Assignees: SGS-Thomson Microelectronics s.r.l., Italy; SGS-Thomson Microelectronics, Inc., Carollton, Tex.

[21] Appl. No.: 449,675

[22] Filed: May 24, 1995

Related U.S. Application Data

[62] Division of Ser. No. 144,300, Oct. 28, 1993, Pat. No. 5,489,752.

[30] Foreign Application Priority Data

Feb. 15, 1992 [EP] European Pat. Off. ............. 92830672

[51] Int. Cl.$^6$ .................................................. H05K 3/34
[52] U.S. Cl. ............................ 29/840; 29/832; 174/52.2; 437/211
[58] Field of Search ........................ 174/52.2; 437/211; 29/832, 840

[56] References Cited

U.S. PATENT DOCUMENTS

| | | | |
|---|---|---|---|
| 3,991,347 | 11/1976 | Hollyday. | |
| 4,143,456 | 3/1979 | Inoue | 174/52.5 X |
| 4,396,936 | 8/1983 | McIver et al. | 174/52.2 X |
| 4,483,067 | 11/1984 | Permentier | 174/52.2 X |
| 4,644,445 | 2/1987 | Sakuma. | |
| 5,008,213 | 4/1991 | Kolesar, Jr. | 437/211 X |
| 5,266,748 | 11/1993 | Kawakami et al.. | |

FOREIGN PATENT DOCUMENTS

| | | |
|---|---|---|
| 602298 | 6/1994 | European Pat. Off.. |
| 55-048943 | 4/1980 | Japan. |
| 63-041033 | 2/1988 | Japan. |
| 63-41033 | 2/1988 | Japan. |
| 63-314858 | 12/1988 | Japan. |
| 1-196151 | 8/1989 | Japan. |
| 3-268439 | 11/1991 | Japan. |
| 4-142049 | 5/1992 | Japan. |

*Primary Examiner*—Carl J. Arbes
*Attorney, Agent, or Firm*—Felsman, Bradley, Gunter & Dillon, LLP

[57] ABSTRACT

A dam is provided on a surface of a circuit board to which an integrated circuit device is to be mounted. The dam defines a region between the integrated circuit package and the circuit board, and a material is injected into this region after the device has been mounted on the circuit board. This material preferably is a good thermal conductor, assisting in the removal of heat from the device. The injected material also preferably acts as an adhesive, more firmly bonding the device the circuit board.

5 Claims, 1 Drawing Sheet

PROCESS FOR DISSIPATING HEAT FROM A SEMICONDUCTOR PACKAGE

This is a division of application Ser. No. 08/144,300, filed Oct. 28, 1993 now U.S. Pat. No. 5,489,752 issued Feb. 6, 1996.

BACKGROUND OF THE INVENTION

1. Field of the Invention

The present invention relates generally to electronic devices, and more specifically to a technique for mounting integrated circuits to a circuit board.

2. Description of the Prior Art

It is well known that integrated circuit devices generate heat when operated. In some cases, the amount of heat generated is negligible. In others, it is necessary to make some provision for removing the generated heat from the device in order to avoid problems related to overheating.

One common method to remove generated heat is to provide adequate airflow around the package. For devices which generate larger amounts of heat, attachment to metal heat sinks may be required. Use of either technique requires a certain minimum amount of physical space for mounting the device in order to obtain the necessary heat transfer capacity.

With some system designs, use of large metallic heat sinks is not possible. This is often the case when a large number of integrated circuit devices are attached to a printed circuit board. If the system in which the circuit board is to be used has a minimum of available space for the board, it is often difficult to obtain enough airflow around the devices attached to it to ventilate them properly.

As is known in the art, overheating of the integrated circuit devices attached to circuit boards can adversely impact their proper operation. Temporary marginal or faulty operation is common when devices are overheated, and long term device degradation can occur with regular use at high temperatures.

It would be desirable to provide a technique for improving the heat dissipation of integrated circuit devices attached to a printed circuit board. Preferably, such technique would introduce only minimal complexity to the assembly process, and result in circuit boards which combine a low profile with good heat dissipation characteristics.

SUMMARY OF THE INVENTION

Therefore, in accordance with the present invention, a dam is provided on a surface of a circuit board to which an integrated circuit device is to be mounted. The dam defines a region between the integrated circuit package and the circuit board, and a material is injected into this region after the device has been mounted on the circuit board. This material preferably is a good thermal conductor, assisting in the removal of heat from the device. The injected material also preferably acts as an adhesive, more firmly bonding the device the circuit board.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
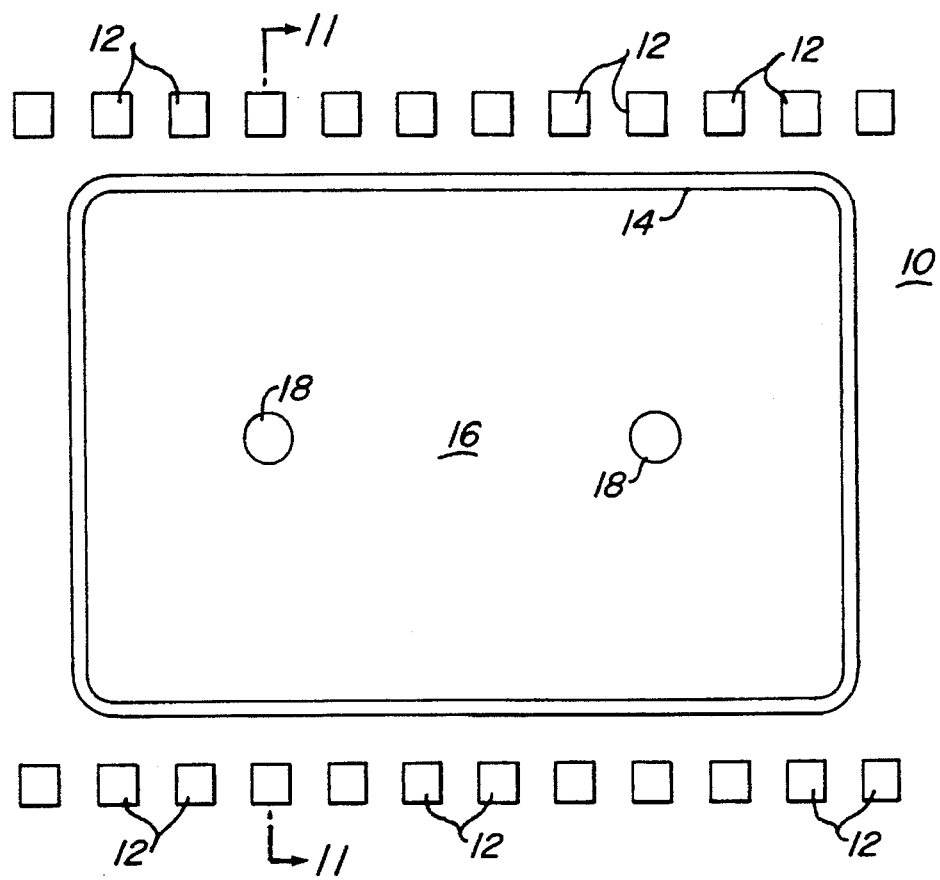
FIG. 1 is a top view of a portion of a printed circuit board according to the present invention.

Referring to FIG. 1, a portion of a printed circuit board 10 is shown. A plurality of contact pads 12 are located as known in the art in positions suitable for attachment of a surface mounted semiconductor integrated package (not shown in FIG. 1). Each of the contact pads 12 will contact one lead of an integrated circuit device, which will be mounted thereto with a material such as solder.

Between the two rows of contact pads 12, a dam 14 surrounds a region 16. As will be described in connection with FIG. 2, dam 14 has a height which is approximately equal to the normal spacing between the PC board 10 and the underside of the integrated circuit chip which is to be mounted.

Through holes 18 extend through the printed circuit board 10 to form apertures on the underside. As will be described below, these through holes are used to inject a thermally conductive adhesive into the region 16 after the integrated circuit chip has been bonded into place on the contact pads 12.

Figure 2:
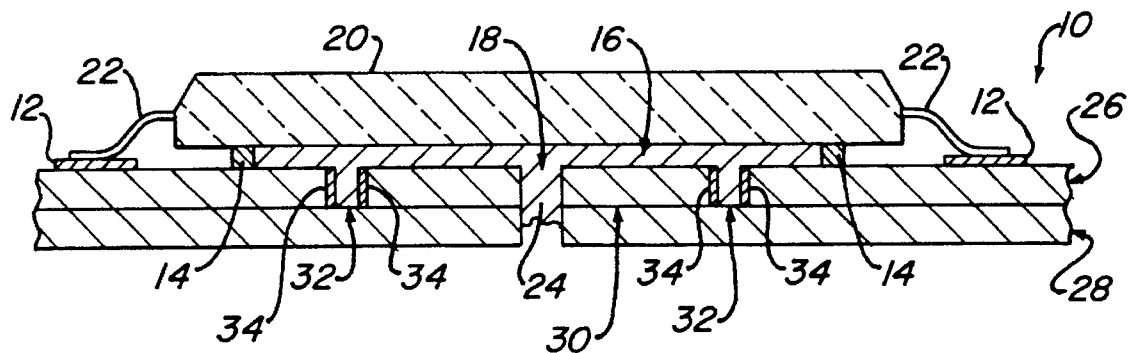
FIG. 2 is a cut away view showing an integrated circuit package attached to a printed circuit board according to the present invention.

Referring to FIG. 2, a cross section is shown of the PC board after an integrated circuit has been bonded into place in accordance with the present invention. An integrated circuit package 20 is typically formed from an injection molded resin, and contains an active electronics device (not shown). Leads 22 extend from the integrated circuit package, and are bonded to the contact pads 12 using a conductive solder as known in the art.

Once the integrated circuit package 20 has been bonded to the PC board 10, a thermally conductive adhesive 24 is injected into the region 16 through the through hole 18. This adhesive is a good thermal conductor, and helps carry away heat generated by the chip within the package 20. An example of a material suitable for this purpose is THERMALLOY 4951, manufactured by THERMALLOY of Texas. Since the adhesive fills substantially all of the space 16 between the package 20 and the printed circuit board 10, a low thermal resistance path is available to carry heat away from the package. The adhesive 24 also serves the secondary purpose of improving the physical bond between the chip 20 and the printed circuit board 10, improving reliability of the system in less hospitable environments.

The dam 14 has a height which is approximately equal to the normal spacing which would exist between the integrated circuit 20 and the printed circuit board 10 if the dam 14 and adhesive 24 were not used. This causes the integrated circuit package 20 to rest on the dam 14, which prevents adhesive from flowing beyond the region 16 during injection. If there is a less than perfect fit between the dam 14 and the package 20, allowing a small amount of adhesive to escape the region contained within the dam 14, no harm is caused and the desired properties are still obtained. During injection of the adhesive 24, it may be desirable to force the integrated circuit package 20 against the dam 14. This minimizes the amount of adhesive which will escape between the dam 14 and package 20.

The dam 14 can be formed from any material which is suitable for use with the printed circuit board 10. For example, the dam 14 could be formed from the same material used to fabricate the printed circuit board and attached to the board using an appropriate adhesive, such as an epoxy adhesive. This is a technique similar to techniques for attaching various structures to printed circuit boards as are well known in the art.

FIG. 2 illustrates another feature of the preferred embodiment which helps improve the heat transfer capabilities of this process. As is known in the art, printed circuit board 10 is often a multiple layer board, having metal traces running between different layers of the board as well as on the top and bottom surfaces thereof. FIG. 2 illustrates a two layer board, having a top layer 26 and a bottom layer 28. Metallic traces (not shown) are located along the interface 30 between the top and bottom layers 26, 28. Power supply traces, which tend to be fairly large, can have a fairly significant capacity for carrying away waste heat.

FIG. 2 illustrates two through holes 32 formed in the upper layer 28. These holes 32 are preferably plated by conductor forming regions 34 as shown. Formation of plated through holes is well known in the art, and used in the formation of the printed circuit board in order to provide connections between metal traces on different surfaces of the printed circuit board 10. In the present context, these plated through boles 32 are used simply to provide a mechanism for allowing thermally conductive regions to make contact with metal traces, such as power traces, which are located along the interface 30. Both the plated regions 34, and that part of the thermally conductive adhesive 24 which extends into the through holes 32, provide good thermal conductors for transferring heat from the package 20 to the underlying conductive traces. The through holes 32 are preferably formed and plated simultaneously with others used to carry signals between planes of the printed circuit bard.

The process described above has a number of useful advantages and features. The integrated circuit packages 20 are attached to the printed circuit board in a conventional manner, so that new processes are not required. A low profile is maintained, since it is not necessary to leave a large air gap underneath the package 20 to ensure that proper heat transfer occurs through convective cooling. The heat sink represented by the power supply lines can be significant, and allows for better cooling for the package 20 than would occur through normal convective cooling. The board can be assembled and tested, and reworked if necessary, prior to injection of the conductive adhesive 24. This minimizes the amount of extra effort required in order to realize the benefits of this invention.

The precise size and shape of the dam 14, and size and location of the through holes 18 and 32, can be varied as desired to suit the requirements of a particular design. In many cases, a single through hole 18 is all that is required for injection of the thermally conductive adhesive. The height of the dam 14 can be varied to suit the spacing requirements normally encountered. In fact, if pressure is applied to the top side of the package 20 during thermally conductive adhesive injection, the presence of the dam 14 can actually improve the planarity of the assembled device by compensating for any variability which would normally occur in the spacing between the integrated circuit package 20 and the printed circuit board 10.

Various modifications of the embodiment described above will become apparent to those skilled in the art. For example, the aperture through which the thermally conductive adhesive is injected need not extend through the printed circuit board as shown in FIG. 2. It can, if the design requires, be made through the dam itself, with the adhesive being injected through the opening from the top side of the printed circuit board. As another example, the material injected into the region between the package and the printed circuit board may be selected primarily or entirely for its thermal conductivity properties, and having little or no adhesive properties. Alternatively, the injected material may function solely as an adhesive, with little capacity for thermal conduction. The properties of the injected material will be chosen depending on the nature of the design.

While the invention has been particularly shown and described with reference to a preferred embodiment, it will be understood by those skilled in the art that various changes in form and detail may be made therein without departing from the spirit and scope of the invention.

What is claimed is:

1. A method for attaching an integrated circuit package to a circuit board, comprising the steps of:

forming a dam on a first surface of a printed circuit board, wherein the dam defines a region;

forming a plurality of conductive pads on the first surface of a printed circuit board and adjacent the dam;

placing a packaged integrated circuit device onto the dam to define a cavity, and bonding leads of the device to the conductive pads;

injecting a thermally conductive material into the cavity to fill the cavity.

2. The method of claim 1, wherein the injected material is an adhesive material.

3. The method of claim 1, wherein the material is injected through an opening in the circuit board from a second side opposite the first side.

4. The method of claim 1, further comprising the steps of:

before the placing step, forming a through hole from the first surface of the printed circuit board, within the defined region, to a layer within the printed circuit board which has at least one conductive metallic trace;

wherein the step of injecting the thermally conductive material also causes the thermally conductive material to fill the through hole.

5. The method of claim 4, further comprising the step of:

before the placing step, plating the through hole with a metallic conductor.

\* \* \* \* \*